United States Patent
Daeche et al.

(10) Patent No.: US 7,031,170 B2
(45) Date of Patent: Apr. 18, 2006

(54) ELECTRONIC DEVICE HAVING A PLASTIC HOUSING AND COMPONENTS OF A HEIGHT-STRUCTURED METALLIC LEADFRAME AND METHODS FOR THE PRODUCTION OF THE ELECTRONIC DEVICE

(75) Inventors: Frank Daeche, München (DE); Franz Petter, Schwabhausen (DE)

(73) Assignee: Infineon Technologies AG, Munich (DE)

( * ) Notice: Subject to any disclaimer, the term of this patent is extended or adjusted under 35 U.S.C. 154(b) by 363 days.

(21) Appl. No.: 10/261,860

(22) Filed: Sep. 30, 2002

(65) Prior Publication Data

US 2003/0076666 A1    Apr. 24, 2003

(30) Foreign Application Priority Data

Sep. 28, 2001 (DE) .................... 101 48 042

(51) Int. Cl.
*H05K 7/04* (2006.01)
*H01L 23/48* (2006.01)

(52) U.S. Cl. .......... 361/813; 361/805; 361/806; 361/808; 361/811; 361/812; 361/820; 257/666; 257/676; 257/728; 29/854; 29/855; 29/856; 438/121; 438/123; 438/124

(58) Field of Classification Search ............ 361/813; 257/666, 676; 29/854, 855, 856
See application file for complete search history.

(56) References Cited

U.S. PATENT DOCUMENTS

| | | | |
|---|---|---|---|
| 5,075,759 A * | 12/1991 | Moline | 257/692 |
| 5,200,362 A | 4/1993 | Lin et al. | |
| 6,093,584 A | 7/2000 | Fjelstad | |
| 6,333,252 B1 * | 12/2001 | Jung et al. | 438/612 |
| 6,380,062 B1 * | 4/2002 | Liu | 438/613 |
| 6,387,730 B1 * | 5/2002 | Guillot | 438/107 |
| 6,451,627 B1 * | 9/2002 | Coffman | 438/111 |
| 6,498,392 B1 * | 12/2002 | Azuma | 257/676 |
| 6,528,879 B1 * | 3/2003 | Sakamoto et al. | 257/729 |
| 6,700,188 B1 * | 3/2004 | Lin | 257/684 |
| 6,713,317 B1 * | 3/2004 | Knapp et al. | 438/106 |
| 6,762,118 B1 * | 7/2004 | Liu et al. | 438/613 |
| 6,787,389 B1 * | 9/2004 | Oohira et al. | 438/106 |

FOREIGN PATENT DOCUMENTS

| | | |
|---|---|---|
| DE | 100 04 410 A1 | 8/2001 |
| JP | 03094459 A | 4/1991 |

* cited by examiner

*Primary Examiner*—John B. Vigushin
(74) *Attorney, Agent, or Firm*—Laurence A. Greenberg; Werner H. Stemer; Ralph E. Locher

(57) ABSTRACT

An electronic device has a plastic housing. The plastic housing has components of a height-structured metallic leadframe. The components are in a matrix form and contain contact islands and chip islands on the underside of the plastic housing. Furthermore, the electronic device has a first line structure containing height-structured interconnects on the underside of the plastic housing and a second line structure containing bonding connections which are disposed within the plastic housing.

64 Claims, 6 Drawing Sheets

ELECTRONIC DEVICE HAVING A PLASTIC HOUSING AND COMPONENTS OF A HEIGHT-STRUCTURED METALLIC LEADFRAME AND METHODS FOR THE PRODUCTION OF THE ELECTRONIC DEVICE

BACKGROUND OF THE INVENTION

Field of the Invention

The invention relates to an electronic device having a plastic housing and components of a leadframe that has height-structured components. The invention also relates to methods for producing the electronic device.

Electronic devices of a hybrid configuration, which have a plurality of passive and active circuit elements in a housing, are realized on ceramic carriers, particularly if radiofrequency circuit elements are involved. Such ceramic carriers have a plurality of wiring layers and are constructed in correspondingly complex fashion. Such complex electronic devices are not only cost-intensive on account of the multilayer ceramic substrates but also have a high failure rate during production.

A further disadvantage of such electronic devices results from the space requirement of the ceramic housings and their external contacts, which cannot be connected compactly to printed circuit board terminals of a superordinate system.

SUMMARY OF THE INVENTION

It is accordingly an object of the invention to provide a electronic device having a plastic housing and components of a height-structured metallic leadframe and methods for the production of the electronic device that overcomes the above-mentioned disadvantages of the prior art devices and methods of this general type, which does not rely on ceramic substrates for the realization of hybrid devices containing passive and active circuit elements within an electronic device housing.

With the foregoing and other objects in view there is provided, in accordance with the invention, an electronic device. The electronic device contains a plastic housing having an underside and components derived from a height-structured metallic leadframe. The components include contact islands and chip islands disposed in a matrix form on the underside of the plastic housing. Two line structures are provided and have a first line structure with height-structured interconnects disposed on the underside of the plastic housing. The height-structured interconnects are further components of the height-structured metallic leadframe. The two line structures further contain a second line structure having bonding connections disposed within the plastic housing.

According to the invention, the electronic device has a plastic housing. The plastic housing contains components of a leadframe that has height-structured metallic components. The components have a matrix of contact islands and chip islands on the underside of the plastic housing. Furthermore, the electronic device has two line structures, of which a first line structure has height-structured interconnects on the underside of the plastic housing and are further components of the height-structured leadframe, while a second line structure contains bonding connections within the plastic housing.

Active components, such as radiofrequency PIN diodes or radiofreguency transistors, can be disposed on the chip islands. Furthermore, electrodes of passive electronic circuit elements can end on the chip islands. Thus, in an advantageous manner, electrodes of radiofrequency capacitors, radiofrequency coils and radiofrequency resistors can be connected to two chip islands in each case. In order to realize more extensive contact-connection of the chip islands, according to the invention, height-structured interconnects are provided from the chip islands on the underside of the plastic housing. The height-structured interconnects end at corresponding contact islands, so that the contact islands at the edge of the electronic device are reached from the contact islands for example via the second line structure containing bonding connections. Consequently, the contact islands of the electronic device can be connected in a space-saving manner, with no major problems, to contact pads on the top side of a superordinate system containing single-layer or multilayer printed circuit boards.

Furthermore, it is possible for the device not only to take up passive electronic devices and to connect active electronic devices to the passive electronic devices in a hybrid manner, but it is also possible to realize line bridges or connecting bridges on account of the two line structures provided according to the invention. In this case, the first line structure can be produced directly with the production of the height-structured components of the metallic leadframe, so that there is no need for a separate method step. Furthermore, in this case a "leadless package" is produced, since the underside both of the contact islands and of the chip islands can simultaneously serve as external contacts.

The electronic device according to the invention is based on a height-structured metallic leadframe. On the elevated height-structured chip islands and the contact islands of the leadframe, it is possible directly to dispose and mount semiconductor chips as active circuit elements and contact-connect them via bonding wires to other elevated height-structured islands of the leadframe. After such a connecting or contact-connecting operation, the constructions thus produced can be coated with a plastic compound, so that the constructions with height-structured interconnects, contact islands, chip islands, semiconductor chips, passive circuit elements and bonding connections are embedded with a plastic housing composition in the form of a polymer coating. The metallic leadframe can be eliminated by a removal operation, so that a matrix containing external contacts which belong to the respective height-structured chip islands or contact islands is present on the underside of the plastic housing composition.

Consequently, after the removal of the leadframe, all that remain are the height-structured components of the leadframe in the plastic compound and also the remaining construction containing bonding connections to passive and active circuit elements. In order to enable the external contact areas of the contact and chip islands on the underside of the electronic device for mounting on a superordinate system, such as a multilayer printed circuit board, these areas can be coated either with a solder or with a conductive adhesive and be applied to the superordinate system. In this case, with the electronic device according to the invention, it is possible to achieve an external contact density that corresponds to BGA housing structures ("ball grid array structures").

Furthermore, the electronic device can also be configured in such a way that a high number of external edge contacts are disposed in the edge region of the electronic device on the underside, by fully exhausting the system according to the invention of two line structures within the electronic device. As a result, a high degree of flexibility and configurational freedom for the configuration of electronic devices of a hybrid configuration is achieved with the electronic device according to the invention. With the novel concept on which the electronic device according to the invention is based, it is possible to realize power amplifier modules for cellular terminals extremely cost-effectively, so that housings with expensive ceramic substrates can be replaced by plastic housings.

In one embodiment of the invention, the electronic device has a structured insulation layer disposed on the underside of the plastic housing on exterior areas of the height-structured interconnects and partly on exterior areas of the contact islands and/or of the chip islands. The structured insulation layer may be a photo-patternable polymer layer. To that end, the polymers can be applied, dried and exposed in a parallel method, that is to say simultaneously for a plurality of undersides of electronic devices. After the exposure, such a photosensitive polymer layer can be developed and fixed, the development resulting in the polymer layer being rinsed away at all points where an insulation layer is not to be disposed, and, during fixing, the residual polymer layer is cross-linked to a greater extent and thus stabilized.

With the aid of such a coating made of a structured insulation layer, the electrically conductive area situated on the underside is reduced by a degree such that it is possible to avoid undesirable contact-connecting possibilities during the mounting method, in particular when fitting the housing on a superordinate system. Furthermore, in the case of electronic devices having a large number of poles, it is possible to produce annularly disposed external contacts and fan them out to the contact islands situated in the edge region.

In a further embodiment of the invention, the electronic device has, above the height-structured interconnects on the underside of the electronic device, line bridges in the form of bonding connections within the plastic housing. This embodiment of the invention provides a further degree of freedom for the configuration and interconnection of the circuit elements contained in the electronic device to form a hybrid module. Furthermore, the bonding connections of electronic devices having a large number of poles can be reduced, through the provision of line bridges and of height-structured interconnects, to values which are possible for electronic devices having a small number of poles, which is associated with an increase in the bonding speed for electronic components having a large number of poles. To that end, in a further embodiment of the invention, the electronic device has a line network containing height-structured interconnects between the chip islands and the contact islands, the network containing height-structured interconnects performing connection functions which, hitherto, have only been able to realized by bonding wires.

In a further embodiment of the invention, passive and active electronic radiofrequency circuit elements are disposed on the chip islands. In this case, on account of their small semiconductor chip size, active radiofrequency circuit elements, such as PIN diodes or radiofrequency transistors, can be disposed directly on a respective chip island and the electrodes situated on the active top side of the electronic components, such as the anode of a PIN diode or the emitter and the base of a radiofrequency transistor, can be accessed from adjacent contact islands via bonding wires.

Passive circuit elements, which take up larger areas and spaces, can be disposed between the chip islands, their electrodes being connected on adjacent chip islands. The chip islands occupied by the electrodes of the passive circuit elements cannot always be provided with additional bonding wires, so that here the inventive solution of height-structured interconnects from the chip islands to adjacent contact islands improves the interconnection possibility of the passive circuit elements in a hybrid circuit. In a further embodiment of the invention, radiofrequency resistors, radiofrequency capacitors and/or radiofrequency coils are used as passive radiofrequency circuit elements.

Consequently, in a further embodiment of the invention, a PIN diode cathode of a radiofrequency PIN diode is electrically conductively connected to one of the chip islands and the chip island is connected via a height-structured line to an adjacent contact island, while a PIN diode anode is connected via a corresponding bonding connection to a further adjacent contact island. In the case of a radiofrequency transistor, the radiofrequency transistor collector is electrically conductively connected to a chip island, while the emitter and the base of the radiofrequency transistor are in each case connected via bonding wires to adjacent contact islands. The chip island on which the radiofrequency transistor is disposed is connected via height-structured interconnects to a further adjacent contact island which, for its part, may be connected to further contact islands or chip islands of other radiofrequency circuit elements of the electronic device to form a hybrid device.

In the above embodiments of the invention, the chip islands, the contact islands and the height-structured interconnects have an identical material thickness, especially as they are formed by the same method step for a plurality of devices simultaneously on a carrier material of a leadframe. In a further embodiment of the invention, it is provided that the chip islands, the contact islands and the height-structured interconnects are formed from copper or a copper alloy. The copper and the copper alloy have the advantage that they can be anchored in a positively (forced) locking manner in the plastic housing composition given a corresponding configuration.

For solder mounting of the semiconductor chips on the chip islands or of the electrodes of the passive circuit elements on corresponding chip islands, in a further embodiment of the invention, it is provided that the top sides of the chip islands have a solderable coating. In a further embodiment of the invention, the solderable coating is embodied as a silver solder coating. The silver solder coating has the advantage over coatings made of tin-lead solders that it does not oxidize.

The contact islands essentially differ from the chip islands in that they have, on their top side, a bondable coating made of gold, silver, aluminum and/or alloys thereof. These coatings enter into a friction-welding connection with the bonding wires, which connection is extremely durable and secure.

For the construction of an electronic device of this type, a leadframe is provided which, in a further embodiment of the invention, has an etching stop layer between the height-structured components such as the chip islands, the contact islands and the height-structured interconnects and an underlying metallic carrier that connects them. Such an etching stop layer is intended to facilitate the removal of the carrier material from the height-structured components that are to be embedded in the plastic housing.

In a further embodiment of the invention, the etching stop layer is formed from nickel or a nickel alloy.

In a further embodiment of the invention, the leadframe for constructing the electronic device according to the invention has a plurality of device positions, in each of which is disposed a matrix containing height-structured components. A matrix of external contact areas on the underside of the electronic device that are assigned to the chip islands and contact islands corresponds to the matrix containing height-structured components. In accordance with the electronic device to be constructed, the leadframe has, in addition, according to the invention, as height-structured components, the chip islands, the contact islands and the height-structured interconnects. The height-structured interconnects have a line network between the chip islands and the contact islands.

In a further embodiment of the invention, the invention contains a panel, which has a plurality of electronic devices disposed in a common plastic molding compound. Each device of the panel has components of the height-structured metallic leadframe. The components again form a matrix containing the contact islands and the chip islands, and have the height-structured interconnects between the contact islands and the chip islands. Disposed on the chip islands are electronic circuit elements that are connected to the contact islands via the height-structured interconnects, it being possible for additional bonding connections to connect the electrodes of the circuit elements to adjacent contact islands. In this case, the bonding connections, the electronic circuit elements and a large part of the surfaces of the chip islands, the contact islands and the height-structured interconnects are embedded in a common plastic molding compound on the panel, so that the panel forms a composite board having a plurality of devices disposed therein. Such a panel has the advantage that it can be produced, stored and also sold in large quantities and thus represents an intermediate product that already has a commercial value.

A method for producing a leadframe having height-structured components has the following method steps:

a) the provision of a metallic carrier material for forming the height-structured leadframe and is in the form of a metal plate or a metal strip;

b) the application of a mask on a top side of the carrier material with a matrix defining uncovered areas of the carrier material for height-structured contact islands, chip islands and interconnects in a plurality of device positions;

c) the application of an etching stop layer to the uncovered areas of the carrier material;

d) the application of a height-structured layer to the etching stop layer in the uncovered areas of the carrier material resulting in the formation of height-structured components of the leadframe; and e) the removal of the mask.

The method has the advantage that the leadframe structure is produced successively for a plurality of electronic devices. The leadframe structure has a matrix of the contact islands and the chip islands in each device position, and the height-structured interconnects are provided in the form of an interconnect network between the contact islands and the chip islands. The height-structured components are held in position by the leadframe and can be equipped with various active and passive circuit elements. For hybrid radiofrequency circuit modules, it is possible to accommodate any desired number of passive and active circuit elements on the chip islands. In this case, each chip island and each contact island has an underside that is connected to the leadframe via an etching stop layer and, after later removal of the leadframe, can form an external contact on the underside of an electronic device.

For the production of a panel containing a composite of a leadframe and height-structured components, the invention employs a method that, in addition to the method steps of the production of the leadframe with the height-structured components, has the following further method steps after the removal of the mask:

a) the application of a bondable coating to contact islands and a solderable coating or a conductive adhesive to chip islands;

b) the application of circuit elements to the chip islands;

c) the production of bonding connections and line bridges between electrodes of the circuit elements and contact islands and/or between contact islands; and d) the one-sided packaging of the device positions in a common layer made of a plastic molding compound resulting in the embedding of the height-structured components, the circuit elements and the bonding connection in the plastic molding compound to form a panel.

Such a panel has the advantage that it can be stored as a composite board with a plurality of device positions and can be processed further in a parallel method. Furthermore, it represents an easily transportable intermediate product that can also be utilized commercially.

A method for producing an electronic device having a plastic housing and components of a height-structured metallic carrier has, in addition to the method steps for producing the leadframe and the panel, the following method steps:

a) the removal of the leadframe of the panel at least as far as the etching stop layer;

b) the application of a structured insulating layer on the underside of the molding compound of the panel for the purpose of covering the undersides at least of the height-structured interconnects; and c) the separation of the leadframe with the plastic molding compound into individual electronic devices.

The method has the advantage that electronic devices are produced which, on their underside, have no uncovered contact areas of height-structured interconnects or of chip islands or contact areas that are not to be contact-connected. The metallic areas are protected by an insulating layer that, in one exemplary implementation of the method, may be a soldering resist layer or a photolithography layer.

In order to produce height-structured components on a carrier material, in a further exemplary implementation of the method, the mask which is required for deposition of the etching stop layer and for deposition of the height-structured components is produced by photolithography. During the photolithography, a photosensitive polymer resist is applied to a carrier material containing a metal plate or metal foil by casting, dipping, spraying or lamination. Through drying and exposure, the dried photoresist layer can then be exposed and subsequently developed using an optical mask. During development, parts and areas of the photoresist layer are stripped away to leave a structured photoresist layer which uncovers the surface of the carrier material at the locations at which height-structured interconnects, contact islands and/or chip islands are intended to be formed. After development, the photoresist layer is fixed and cured in the process, intensive cross-linking of the polymer taking place.

Instead of photolithography, such a mask can also be produced by application by a printing process. In the case of printing technology, a polymer layer can be printed on by a screen printing method, for example, at all points where the surface is to be protected against growth of an etching stop layer and a height-structured metal layer. The same applies to the stencil printing technology, in which a stencil ensures that a polymer layer is applied only on the regions that are intended to be protected against application of an etching stop layer or an elevated height-structured metal layer.

The application of the etching stop layer is preferably made of nickel or a nickel alloy and is effected by a sputtering process or a vapor deposition process. In the case of the processes specified, such as a sputtering process or vapor deposition process, the etching stop layer cannot be applied selectively on the uncovered surfaces of the carrier material, but rather is deposited all together to form a metallic mirror on the entire area of the leadframe. A similar areal deposition is achieved by application of an etching stop layer by a chemical vapor deposition process. In these cases mentioned above, after the whole-area deposition of the etching stop layer, the latter may subsequently have to be structured to leave etching stop layers only in the regions which are intended to form a height-structured component.

In a further exemplary implementation of the method, it is provided that the application of the etching stop layer is effected by an electrodeposition process. The electrodeposition process has the advantage that an etching stop layer is deposited only where this is allowed by uncovered surfaces.

After the deposition of the etching stop layer made, for example, of nickel or a nickel alloy, the height-structured components can then be produced by applying a height-structured layer to the etching stop layer in the uncovered areas of the carrier material by electrodeposition. The electrodeposition of such height-structured layers has the advantage that it remains restricted to the uncovered surfaces and, consequently, a height-structured layer grows only on the etching stop layer. Furthermore, the electrodeposition for producing a height-structured layer has the advantage of a high metal deposition rate, it being possible to deposit the height-structured layer beyond the thickness of the mask layer, as a result of which the structures and components provided acquire a cross-sectional profile which can be anchored in a positively locking manner in the plastics compound that is later to be applied.

After the application of the height-structured components with the aid of the height-structured layer, the mask is removed by chemical solvents or by a plasma incineration method. Removal by chemical solvents is inexpensive, but has a high proportion of chemicals that are a burden on the environment. In contrast, the plasma incineration process is a dry method requiring no solvents whatsoever. Only at the end of the incineration process is it necessary to rinse away the ashes of the mask polymer.

In a further embodiment of the invention, the application of a bondable coating to contact islands will be effected by a sputtering process. The sputtering process can apply very precise, bondable coatings that are restricted to the contact islands. In this case, the thickness of the bondable coatings can be set exactly and the top sides of the contact islands can be coated with gold, silver, aluminum or with alloys thereof with a thickness in the submicron range.

While the application of a solder layer to the chip islands is associated with complicated heating processes, a conductive adhesive, which has electrically conductive filling material in its adhesive, can be applied by adhesive films, which makes the method step significantly easier and less expensive.

After the application of the passive and active circuit elements in the chip islands, the bonding connections can be applied by a thermocompression, thermosonic and ultrasonic bonding process between the electrodes of the circuit elements and the contact islands or between the contact islands themselves. Since there is a network containing height-structured interconnects in addition to the bonding connections, the number of bonding connections can be minimized so that the bonding process can be carried out in a shorter time and, consequently, the bonding speed is significantly improved.

In a further exemplary implementation of the invention, the packaging in a plastics molding compound can be affected by an injection-molding process. In the case of this process, a mold is disposed above the entire leadframe with the height-structured components and a plastic molding compound is introduced between the leadframe and the mold. In the process, the chip islands, the contact islands, the height-structured interconnects, the bonding connections and also the passive and active circuit elements are embedded in the plastic molding compound. The underside of the chip islands and of the contact islands and also the underside of the height-structured interconnects are protected against wetting with plastic by the soldering resist layer. As a result, after the injection molding of the plastics molding compound, the carrier material of the leadframe can be removed as far as the etching stop layer, so that a matrix of external contact areas becomes visible on the underside of the plastic molding compound. In the process, the undersides of the height-structured interconnects are also uncovered, which is undesirable on account of the risk of a short circuit.

By applying a structured insulating layer, it is possible to protect the underside at least of the height-structured interconnects with application of a soldering resist or of a photoresist. Consequently, it is not possible for undesirable contact to be made with the height-structured interconnects.

To summarize, it must be emphasized that plastic leadless packages, such as, for example, P-TSLP housings (plastic thin small leadless packages), can be constructed on a height-structured metallic leadframe. Bare electronic semiconductor chips can be mounted onto the elevated height-structured islands in the form of chip islands and contact islands of the leadframe and be contact-connected via bonding wires to other elevated contact islands of the carrier. After the contact-connecting operation the constructions thus described can be coated with a polymer coating. There then follows a removal operation during which the metallic leadframe is eliminated. What remains is a composite containing components with bonding wire, polymer coating and the elevated islands of the eliminated carrier material of the leadframe. The undersides of the islands are coated with a mounting surface to form external contact areas and serve as connecting areas to a superordinate system, for example a printed circuit board. Consequently, the islands in the form of contact islands and chip islands are to be dimensioned, with regard to their dimensions and their distances, in such a way that they can be mounted by corresponding mounting methods on the superordinate systems and can be electrically connected to the superordinate system.

If the electronic device has a high number of external contacts or if a plurality of electronic devices are to be contact-connected, the elevated islands, under certain circumstances, can no longer be grouped in one contact row around a semiconductor chip mounting location. What is required in this case are multi-row configurations for the external contacts and thus for the matrix of the chip islands and contact islands on the underside of the electronic device. At the same time, this leads to different bonding wire lengths, and the bonding wires would have to be disposed in part one above the other unless the inventive introduction of the height-structured interconnects is incorporated which obviates a large part of the bonding wires. However, the undersides of the height-structured interconnects are visible and contact-connectable on the underside of the mounting area of the electronic device and also on the underside of the plastic housing which can lead to short circuits on the superordinate system, such as a printed circuit board. This is avoided by the structured insulation layer according to the invention on the underside of the plastic housing.

Uncovered surfaces of connecting lines between the contact islands and the chip islands can be covered by a photo-patternable polymer, preferably by a soldering resist. This prevents the electrical contact-connectability. In a parallel method, such polymers are applied to the underside of the plastic housing by spraying, casting, dipping or lamination, dried and subsequently exposed. A development step and a washing-out step then take place. Isolated structured areas of the polymer are then present as a result. Such a coating helps to reduce the area that can be electrically contact-connected externally to a necessary extent and thus to avoid undesirable contact-connecting possibilities through a mounting method. Moreover, in the case of electronic devices having a larger number of poles, too, it is possible to produce contact rings and fan them out to the external mounting islands situated in the edge region.

The invention advantageously enables an internal wiring in the case of substrateless leadless packages and an increase in the bonding speed in the case of electronic devices having a large number of poles. Furthermore, power amplifier modules for cellular terminals can be produced extremely cost-effectively. In this case, housings having a ceramic substrate can be replaced by a housing according to the invention made of a plastic molding compound.

Other features which are considered as characteristic for the invention are set forth in the appended claims.

Although the invention is illustrated and described herein as embodied in an electronic device having a plastic housing and components of a height-structured metallic leadframe and methods for the production of the electronic device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
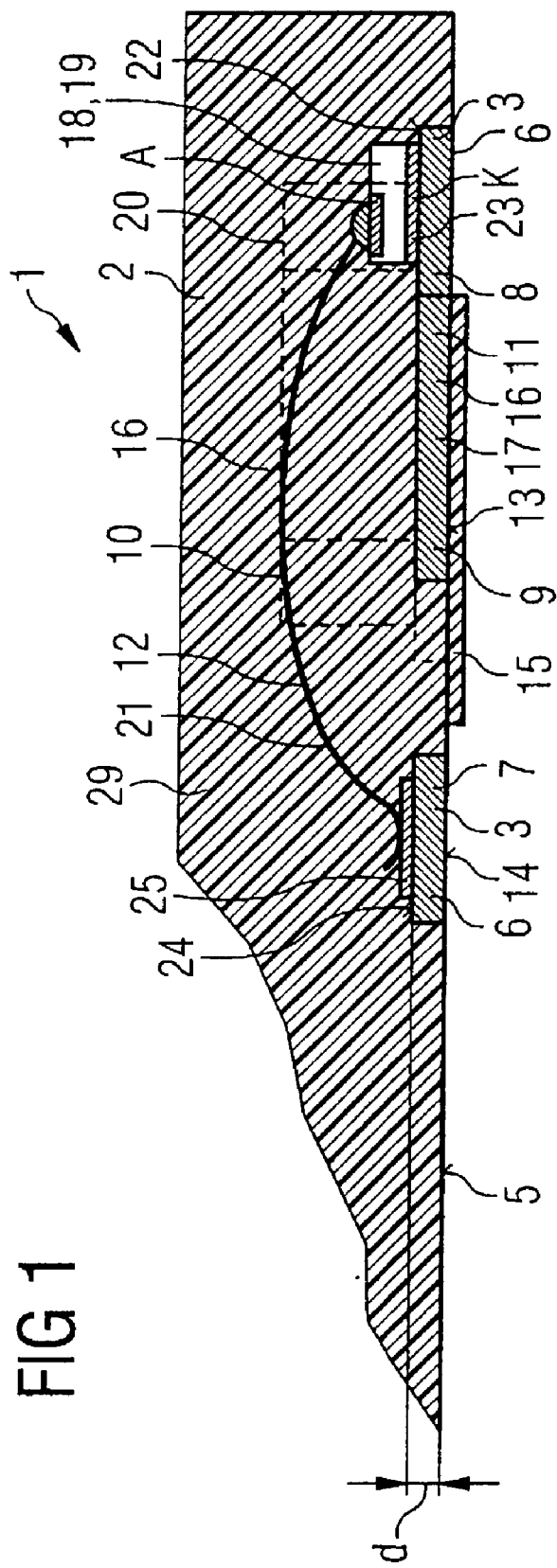
FIG. 1 is a diagrammatic, cross-sectional view through a partial region of an electronic device of an embodiment according to the invention.

Referring now to the figures of the drawing in detail and first, particularly, to FIG. 1 thereof, there is shown a diagrammatic, cross-sectional view through a partial region of an electronic device 1 according to the invention. In FIG. 1, the reference symbol 2 identifies a plastic housing. The reference symbol 3 identifies height-structured components of a leadframe. The reference symbol 5 identifies an underside of the plastic housing 2, on which is situated a matrix 6 containing contact islands 7 and chip islands 8.

The reference symbol 9 identifies a first line structure having height-structured interconnects 11. The reference symbol 10 identifies a second line structure having bonding connections 12. The reference symbol 13 identifies exterior areas of the height-structured interconnects 11. The reference symbol 14 identifies exterior areas of the contact islands 7 and/or chip islands 8, which simultaneously serve as external contact areas for the electronic device 1. The reference symbol 15 identifies an insulation layer that covers the underside 5 and thus the exterior areas 13 of the height-structured interconnects 11.

The reference symbol 16 identifies a conductor or line bridge formed by the two line structures 9 and 10, the bonding connection 12 representing the bridge and the underlying height-structured interconnect 11 being led through below the line bridge 16. The reference symbol 18 identifies a radiofrequency circuit element which, in the embodiment according to FIG. 1, is a PIN diode 19 with a cathode K, which is electrically connected to the chip island 8 and is electrically connected, via the interconnect 11, to a radiofrequency resistor 20 disposed behind the plane of the drawing, with broken lines. The anode A of the PIN diode 19 is connected to the contact island 7 via the bonding connection 12, so that the anode A of the PIN diode 19 can be accessed electrically via the exterior area 14 that is uncovered on the underside of the electronic device 1.

The reference symbol 21 identifies a bonding wire that produces the bonding connection 12 between the anode A of the PIN diode 19 and the contact island 7. The reference symbol 22 identifies a top side of the chip island 8, which is provided with a solderable coating 23. The solderable coating 23 may contain a silver solder, for example, or the coating 23 may also have a conductive adhesive filled with a filling material made of electrically conductive particles.

The reference symbol 24 identifies a top-side of the contact island 7, on which a bondable coating 25 is disposed. In this embodiment of FIG. 1, the bondable coating 25 has aluminum, while the bonding wire 21 is formed of gold with a diameter of between 15 and 30 micrometers. The reference symbol 29 identifies a plastic molding compound that forms the plastic housing 2. The plastic molding compound 29 surrounds the height-structured components 3, the resistor 20, the PIN diode 19 and the bonding connection 12. Consequently, the electronic device 1 does not have a leadframe, but rather only the height-structured components 3 of the leadframe.

Such an electronic device constitutes a hybrid device that has both active elements, such as the PIN diode 19, and passive circuit elements, such as the radiofrequency resistor 20. In particular, the electronic device 1 is characterized by the two line structures 9 and 10, the first line structure 9 containing the height-structured interconnects 11 on the underside 5 of the electronic device 1 and the second line structure 10 containing the bonding connection 12 embedded in the plastic molding compound 29. On account of the two line structures 9 and 10, which are also spatially separate, the line bridges 16 are possible and it is possible to realize a hybrid device which does not have a multilayer ceramic substrate, but rather is essentially composed of the plastic molding compound 29 which is filled with contact and chip islands 7 and 8 and also the height-structured interconnects 11, the bonding wires 12, the passive and active circuit elements 18, 19, 20 in a spatially compact manner.

Figure 2:
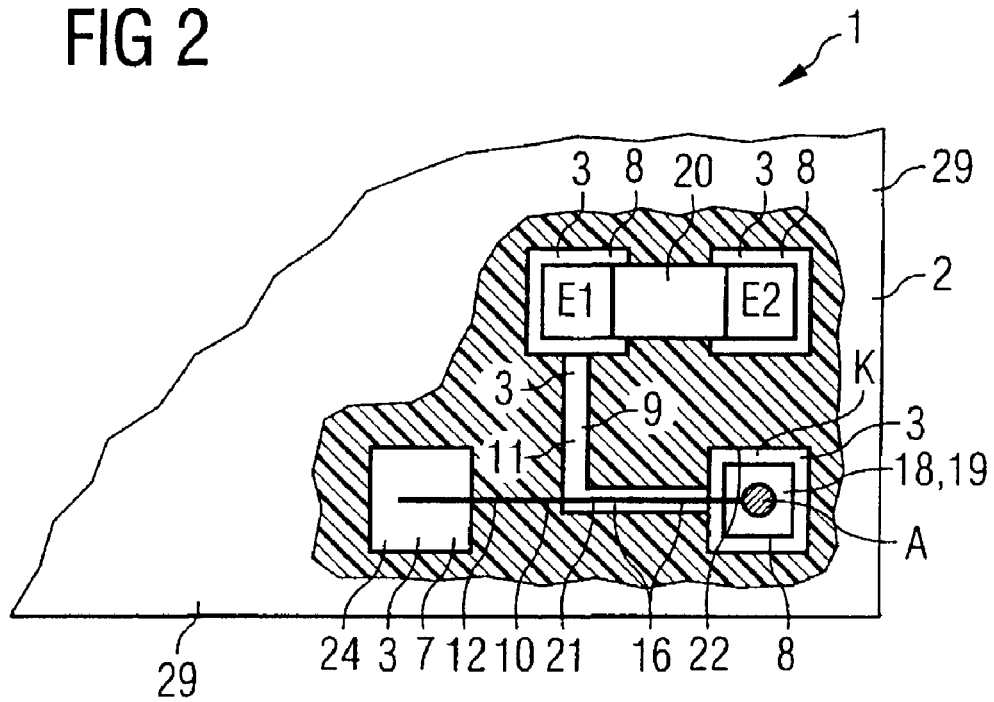
FIG. 2 is a diagrammatic, partly cut-away, plan view of a partial region of the electronic device shown in FIG. 1.

FIG. 2 shows a diagrammatic, partly cut-away plan view of a partial region of the electronic device 1 of the embodiment of the invention that is shown in FIG. 1. Components with functions identical to those in FIG. 1 are identified by identical reference symbols and not discussed separately.

The plastic molding compound 29 of the plastic housing 2 is cut away in FIG. 2 in order to diagrammatically illustrate the configuration of the circuit elements 18, 19 and 20, the chip islands 8 and the contact areas 7. The semiconductor chip of the PIN diode 19 is disposed and electrically connected on the chip island 8 with its cathode K. The chip island 8 with the cathode potential is connected via the height-structured interconnect 11 to the chip island 8 on which one electrode E1 of the radiofrequency resistor 20 is disposed and is electrically connected to the chip island 8. The second electrode E2 of the radiofrequency resistor 20 is disposed on an adjacent chip island 8, the chip islands 8 and the contact islands 7 forming a matrix, and being distributed over the exterior area of the device 1. The illustration of FIG. 2 shows the line bridge 16 formed from the bonding connection 12 and the height-structured interconnect 11.

Figure 3:
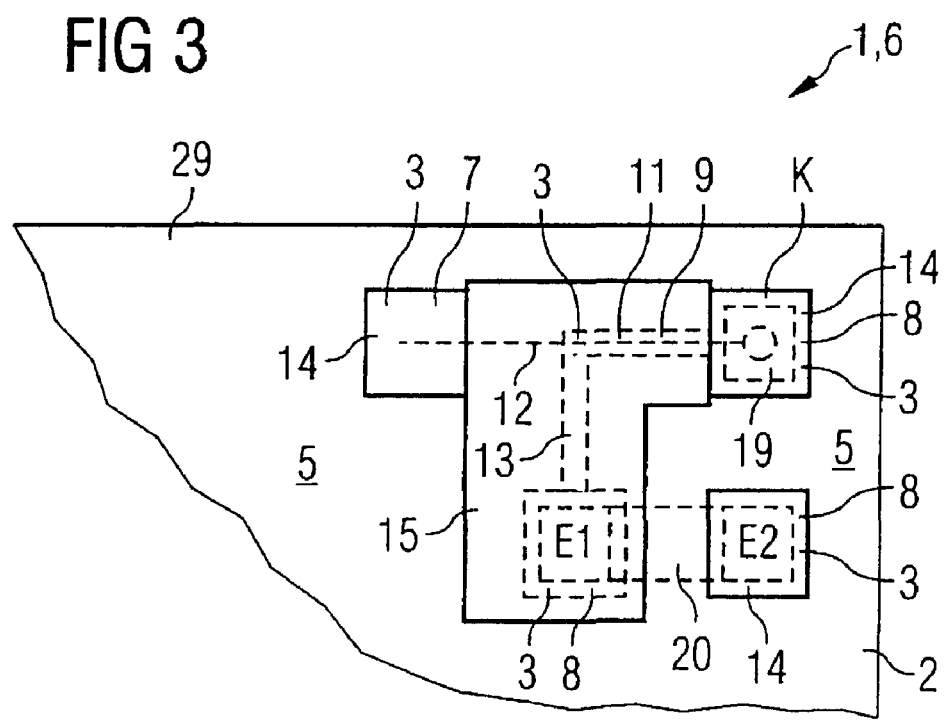
FIG. 3 is a diagrammatic view from below of a partial region of the electronic device shown in FIG. 1.

FIG. 3 shows a diagrammatic view from below of a partial region of the electronic device 1 of the embodiment of the invention shown in FIG. 1. Components with functions identical to those in the previous figures are identified by identical reference symbols and not explained separately.

Exterior areas 14 of the chip islands 8 and of the contact islands 7 are disposed in the matrix 6 on the underside 5 of the electronic device 1. The exterior areas 14 are coated with a solder in order that they can be disposed electrically on a superordinate system, such as a printed circuit board, and be connected to the system. The exterior area 13 of the height-structured interconnect 11, which connects the cathode K of the PIN diode 19 to one electrode E1 of the radiofrequency resistor 20, depicted by broken lines, is covered with the insulation layer 15. The insulation layer 15 simultaneously covers the external area of the contact island 8, which is connected to one of the electrodes of the radiofrequency resistor 20. In this embodiment, the insulation layer 15 contains a soldering resistor that has been structured by photolithography methods.

Figure 4:
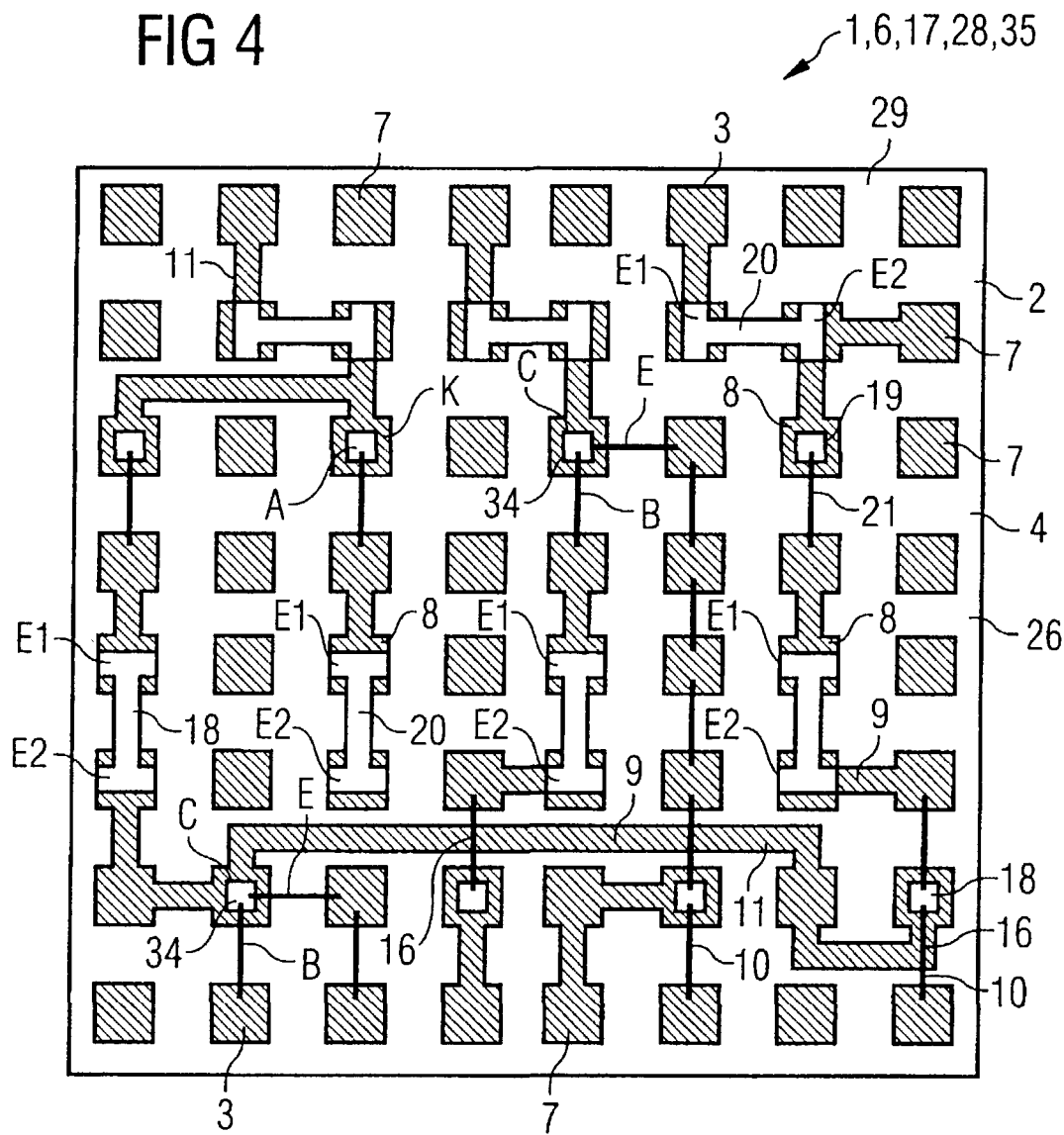
FIG. 4 is a diagrammatic, plan view of a device position of a leadframe with a pattern containing height-structured components which are occupied by circuit elements and line bridges containing bonding connections and height-structured interconnects.

FIG. 4 shows a diagrammatic plan view of a device position 28 of a leadframe 4 with the pattern or matrix 6 containing the height-structured components 3 which are occupied by the circuit elements 18, 19, 20 and the line bridges 16 containing the bonding connections 12 and the height-structured interconnects 11. Components with functions identical to those in the previous figures are identified by identical reference symbols and not discussed separately.

The diagrammatic plan view shows a panel 35 that is open from above and has not yet been completed to form a composite board containing the plastic molding compound 29 and the leadframe 4. Rather, FIG. 4 shows the device position 28 of the leadframe 4 with the height-structured components 3, the chip islands 8 and the contact islands 7 being disposed to form the matrix 6 containing eight by eight height-structured components 3 on the leadframe 4. The sixty-four islands 7 and 8 are used in part as the contact islands 7 and in part as the chip islands 8 in the diagrammatic circuit and configuration.

The radiofrequency resistors 20 are disposed between some of the chip islands 8, which resistors 20 are electrically connected by their electrodes E1 and E2 in each case on a chip island 8. The chip islands 8 of the electrodes E1 and E2 are connected to adjacent contact islands 8 through the height-structured interconnects 11. The height-structured interconnects 11 form a line network 17 in the first line structure 9 on the underside 5 of the electronic device 1. Such an electronic device 1 of hybrid construction contains, in this embodiment of the invention, not only the passive radiofrequency resistors 20, but also the radiofrequency PIN diodes 19 which are disposed and electrically connected by their cathodes K on corresponding chip islands 8 and are connected by their anodes A via bonding connections to adjacent contact islands 7.

The bonding connections 12 form the second line structure 10, which is later embedded completely into the plastic molding compound. The interconnect bridges 16 are provided at a plurality of locations in the hybrid device, the bonding wires 21 bridging the height-structured interconnects 11. In order to ensure good access to the external connections of the electronic circuit, the input and output connections are disposed on the outer ring of contact islands 7.

While the PIN diodes 19 require only one bonding connection for the anode A to an adjacent contact island 7, the radiofrequency transistors 34 bear with their collector connection C on the corresponding chip islands 8 and have, on their top side, two bonding connections 12 which are led respectively to an emitter E and to a base B of the radiofrequency transistor 34. Consequently, the radiofrequency transistors 34 are connected to at least two adjacent contact islands 7 via corresponding bonding connections 12. FIG. 4 shows that great configurational freedom for hybrid radiofrequency devices can be realized using the principles of the invention.

FIGS. 5 to 14 diagrammatically show in cross section a step by step production of the leadframe 4, the panel 35 and the electronic device 1 having the height-structured components 3. Components in FIGS. 5 to 14 with functions identical to those in the previous figures are identified by identical reference symbols and are not discussed separately.

Figure 5:
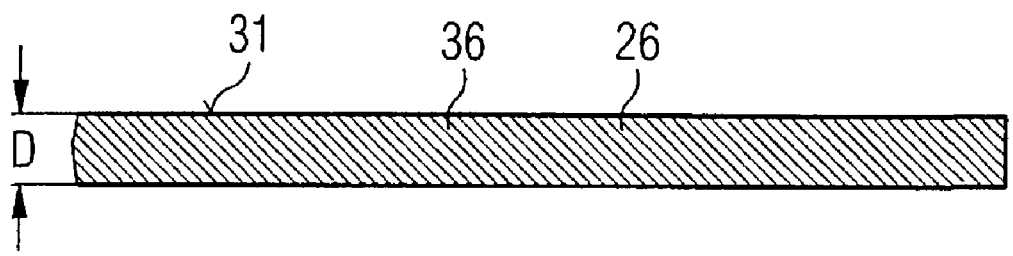
FIGS. 5 to 14 are diagrammatic, cross-sectional views showing step by step production steps for producing a leadframe, a panel and an electronic device having height-structured components.

FIG. 5 shows a cross section through a metal plate 36 or a metal foil which is made available as a carrier material 26 having a thickness D for the construction of the leadframe 4 with the height-structured components 7, 8, 11 and also of the panel 35 and finally of the electronic device 1. The metal plate 36 has a top side 31, which is completely planar. The metal plate 36 itself contains copper or a copper alloy in this embodiment of the invention.

Figure 6:
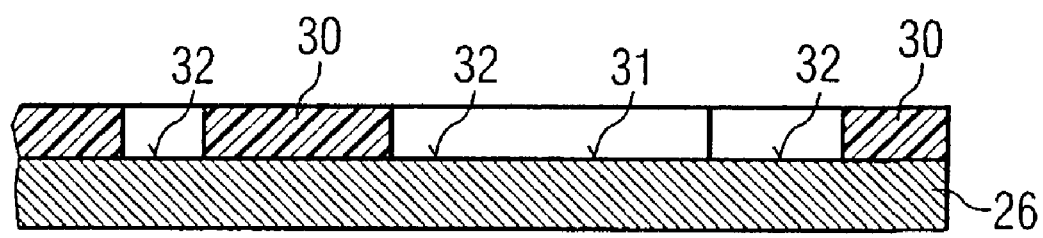

FIG. 6 shows a cross section through the carrier material 26, as is illustrated in FIG. 5, which has a structured mask 30 on its top side 31. In this embodiment, the structured mask 30 was applied with the aid of a photoresist step, the photoresist having a thickness in the range from 1 to 10 micrometers in this embodiment of the invention. The photoresist layer 30 has uncovered (open) areas 32 within the mask 30 which serve for producing the contact and chip islands 7, 8 and, are provided for producing the height-structured interconnects 11.

Figure 7:
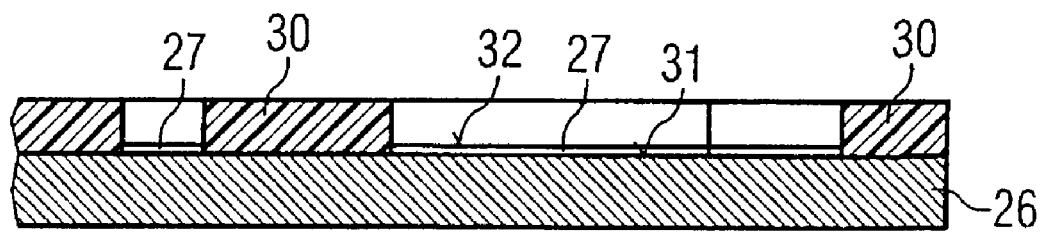

FIG. 7 shows a cross section through the carrier material 26, as in the previous figures, and, in the uncovered areas 32 on the top side 31 of the carrier material 26, a first electrodeposited coating in the form of an etching stop layer 27.

The etching stop layer 27 contains a nickel alloy that was deposited in a corresponding electrodeposition bath with the application of a negative potential to the carrier material 26.

Figure 8:
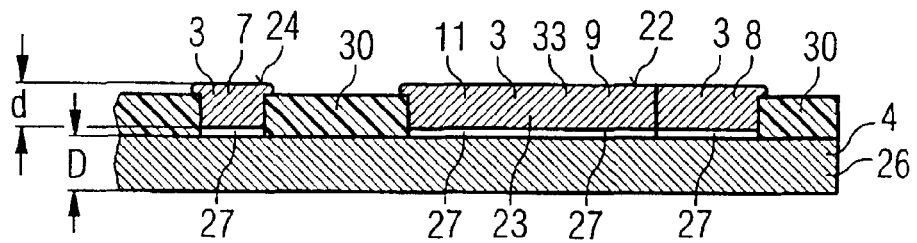

FIG. 8 shows a cross section through the carrier material 26 with filled regions of the uncovered areas 32 of FIG. 6. A height-structured layer 33 has been deposited in the meantime on the etching stop layer 27. The layer 33 contains a copper alloy and was produced in an electrolytic bath essentially containing copper vitriol. In this case, the electrodeposition process was continued until the material thickness d of the height-structured layer 33 exceeds the thickness of the etching mask 30.

Figure 9:
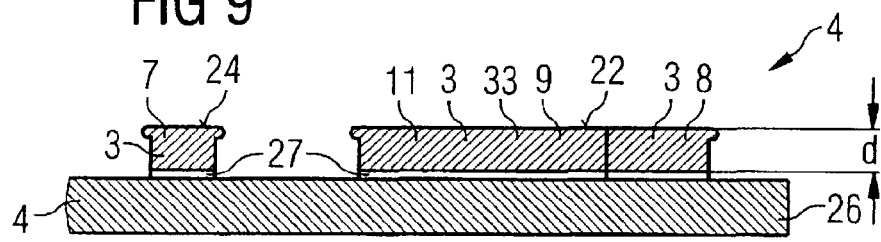

FIG. 9 shows a cross section through the completed leadframe 4 with the height-structured components 3 after the removal of the mask 30 shown in the previous FIGS. 6 to 8. From the leadframe 4 with the height-structured components 3, only the height-structured components are incorporated into the electronic device. In FIG. 9, the height-structured components contain a matrix of the contact islands 7 and the chip islands 8 which are partly connected via a line network containing the height-structured interconnects 11.

Figure 10:
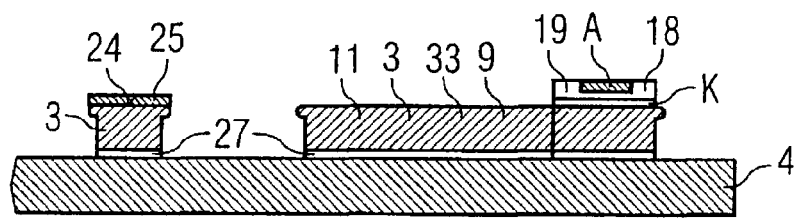

FIG. 10 shows a cross section through the leadframe 4 with the height-structured components 3, the bondable coating 25 being applied on the top side 24 of the contact island 7 and a solderable coating 23 being present on the chip island 8, to which coating the PIN diode 19 is electrically applied and electrically connected by the cathode K. In the embodiment, the solder layer 23 is a silver solder, but may also be a conductive adhesive which electrically connects the cathode K of the PIN diode 19 to the chip island 8. From the chip island 8, the height-structured interconnect 11 leads in the same material thickness d to an adjacent contact island 7.

Figure 11:
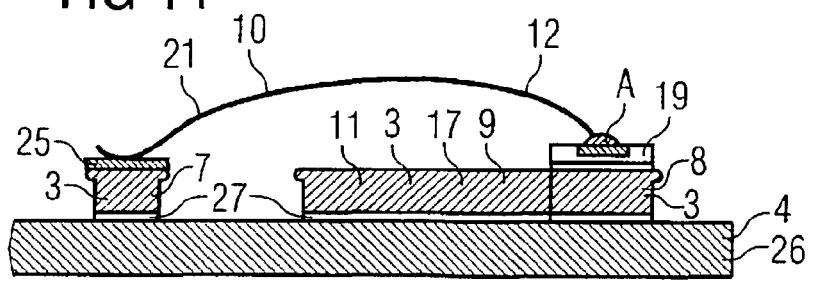

FIG. 11 shows a cross section through the leadframe 4 with applied circuit elements 18 and the bonding connection 12. The bonding connection 12 connects the anode A of the PIN diode 19 via the bonding wire 21 to the contact island 7, with bridging of the height-structured interconnect 11. Consequently, this embodiment of the invention realizes two line planes, namely the first line structure containing a line network of height-structured interconnects 11, and a further line structure constructed from the bonding connections 12.

Figure 12:
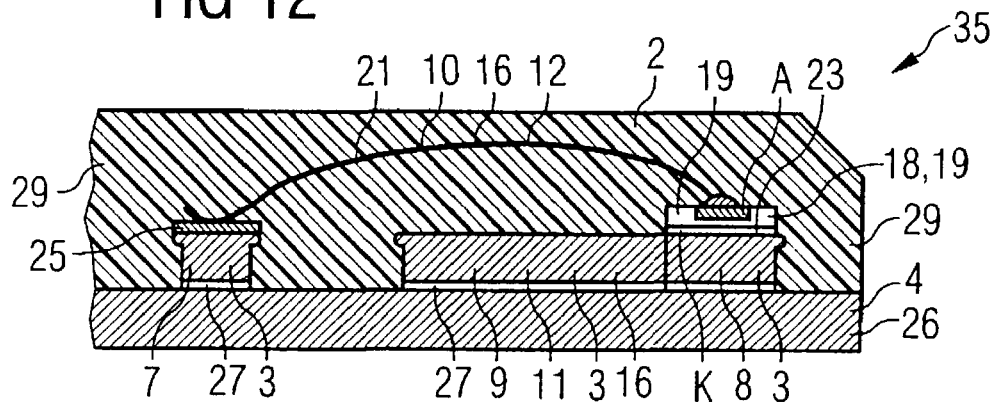

FIG. 12 shows a cross section through the panel 35, which essentially contains the leadframe 4 with the height-structured components 3 and the active and passive circuit elements 18 in a plastic housing 2. The plastic housing 2 is a board made of the plastic molding compound 29 that extends over a plurality of device positions of the panel 35. Consequently, the panel 35 constitutes a composite containing the leadframe 4 and the plastic molding compound 29, the plastic molding compound 29 enclosing the height-structured components 3 and the height-structured interconnects 11, bonding connections 12 and the circuit elements 18. Such a composite board is extremely stable and can thus be stored and can be traded as an intermediate product.

Figure 13:
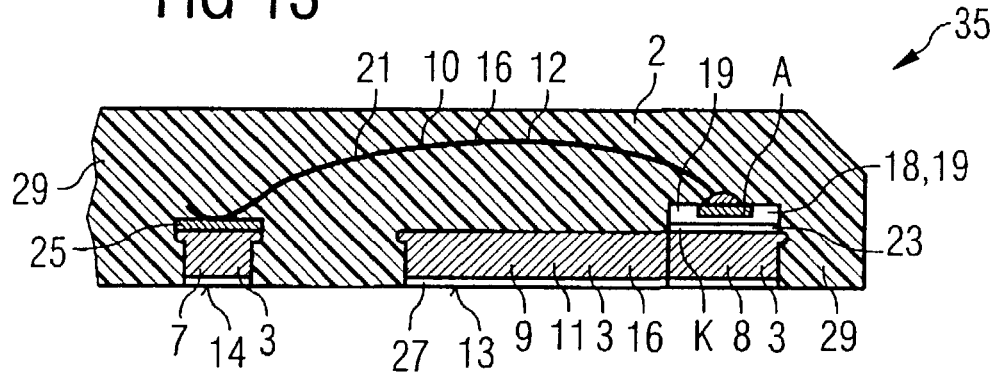

FIG. 13 shows the panel 35 in cross section with the same components as FIG. 12, but the carrier material 26, which could still be seen in FIG. 12, has now been etched away. Such an etching step may be affected in an alkaline solution in which the copper of the carrier material 26 is dissolved. The etching step is checked by the etching stop layer essentially containing a nickel alloy, so that the panel 35 without the carrier material 26 is available. The etching stop layer 27 can be removed in a separate process. Finally, a connecting layer can be applied to the underside of the contact islands 7 and the chip islands 8. In order to avoid short circuits in the superordinate circuit on a printed circuit board or a ceramic plate, at least the underside of the height-structured interconnects 11 is provided with an insulation layer 15.

Figure 14:
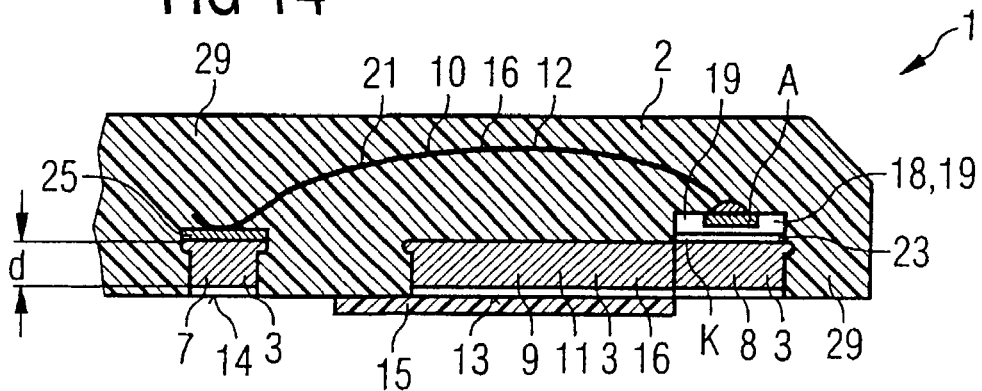

FIG. 14 shows a cross section through the electronic device 1 in hybrid technology with the passive and active circuit elements 18, which are connected to one another in two line structures 9 and 10, one line structure 9 being obtained from height-structured interconnects 11 forming a line network, and the second line structure 10 containing bonding connections 12 within the plastic housing 2. In order to avoid short circuits for the superordinate system, the underside of the first line structure 9 containing the height-structured interconnects 11 is protected by the insulation layer 15, which is composed of a soldering resist in this embodiment.

We claim:

1. An electronic device, comprising:
a plastic housing having an underside;
components derived from a height-structured metallic leadframe, said components including contact islands and chip islands disposed in a matrix form on said underside of said plastic housing; and
two line structures having a first line structure with height-structured interconnects disposed on said underside of said plastic housing, said height-structured interconnects being further components of said height-structured metallic leadframe, said height-structured interconnects forming an interconnect network between said chip islands and said contact islands, said two line structures containing a second line structure having bonding connections disposed within said plastic housing.

2. The electronic device according to claim 1, further comprising a structured insulation layer disposed at said underside of said plastic housing on exterior areas of said height-structured interconnects and partly on exterior areas of said contact islands and of said chip islands.

3. The electronic device according to claim 1, wherein at least some of said bonding connections form line bridges disposed above said height-structured interconnects in said plastic housing.

4. The electronic device according to claim 1, wherein said height-structured interconnects have a line network between said chip islands and said contact islands.

5. The electronic device according to claim 3, further comprising passive and active electronic radiofrequency circuit elements disposed on said chip islands, and said height-structured interconnects electrically connect said radiofrequency circuit elements to one another via said contact islands on said underside of said plastic housing.

6. The electronic device according to claim 5, wherein said radiofrequency circuit elements are selected from the group consisting of a PIN diode, a radiofrequency resistor, a radiofrequency transistor, a radiofrequency capacitor and a radiofrequency coil.

7. The electronic device according to claim 6, wherein said PIN diode has a cathode electrically conductively connected to one of said chip islands and further connected through said height-structured line to an adjacent one of said contact islands and an anode connected through one of said bonding connections to a further adjacent one of said contact islands.

8. The radiofrequency device according to claim 6, further comprising bonding wires, and said radiofrequency transistor has a collector electrically conductively connected to one of said chip islands, an emitter and a base, said emitter and said base connected through said bonding wires to adjacent one of said contact islands, and said one of said chip islands and said adjacent ones of said contact islands being connected via said height-structured interconnects to at least one of further ones of said contact islands and said chip islands containing other ones of said radiofrequency circuit elements.

9. The electronic device according to claim 1, wherein said chip islands, said contact islands and said height-structured interconnects have an identical material thickness.

10. The electronic device according to claim 1, wherein said chip islands, said contact islands and said height-structured interconnects are formed of a material selected from the group consisting of copper and a copper alloy.

11. The electronic device according to claim 1, wherein each of said chip islands has a top side and a solderable coating disposed at said top side.

12. The electronic device according to claim 1, wherein said chip islands each have a top side and a silver solder coating disposed at said top side.

13. The electronic device according to claim 1, wherein said contact islands each have a top side and a bondable coating disposed at said top side.

14. The electronic device according to claim 1, wherein said contact islands each have a top side and a bondable coating disposed at said top side, said bondable coating formed of a material selected from the group consisting of gold, silver, aluminum and alloys of thereof.

15. A leadframe for constructing an electronic device, the leadframe comprising:
  height-structured components including contact islands and chip islands disposed in a matrix form and a first line structure with height-structured interconnects;
  a metallic carrier material; and
  an etching stop layer disposed between said height-structured components and said metallic carrier material.

16. The leadframe according to claim 15, wherein said etching stop layer contains nickel or a nickel alloy.

17. The leadframe according to claim 15, wherein said height-structured components are disposed in a matrix format and define a plurality of device positions.

18. The leadframe according to claim 15, wherein said height-structured components include chip islands, contact islands and height-structured interconnects, said height-structured interconnects having a line network disposed between said chip islands and said contact islands.

19. A panel, comprising:
  a common plastic molding compound having an underside; and
  a plurality of electronic devices disposed in said common plastic molding compound, each of said electronic devices including:
    electronic circuit elements;
    bonding connections; and
    components derived from a height-structured metallic leadframe, said components including contact islands and chip islands disposed in a matrix form and height-structured interconnects, said chip islands carrying said electronic circuit elements and each of said contact islands connected to at least one of said chip islands and to one another partly through said height-structured interconnects on said underside of said plastic molding compound and partly through said bonding connections disposed within said plastic molding compound, said plastic molding compound and said components of said height-structured leadframe forming a compact composite board with said electronic devices disposed therein.

20. A method for producing a leadframe, which comprises the steeps of:
  providing a metallic carrier material selected from the group consisting of a metal plate and a metal strip;
  applying a mask on a top side of the metallic carrier material, the mask containing a matrix of uncovered areas exposing the metallic carrier material for forming contact islands, chip islands and interconnects in a plurality of device positions;
  applying an etching stop layer to the uncovered areas of the metallic carrier material;
  applying a height-structured layer to the etching stop layer in the uncovered areas of the metallic carrier material, the height-structured layer having a formation of height-structured components forming the contact islands, the chip islands and the interconnects; and
  removing the mask.

21. The method according to claim 20, which comprises using a photolithographic process for applying the mask.

22. The method according to claim 20, which comprises using a printing process for applying the mask.

23. The method according to claim 20, which comprises applying the etching stop layer by one of a sputtering process and a vapor deposition process.

24. The method according to claim 20, which comprises using a chemical vapor deposition process for applying the etching stop layer.

25. The method according to claim 20, which comprises using an electrodeposition process for applying the etching stop layer.

26. The method according to claim 20, which comprises using an electrodeposition process for applying the height-structured layer to the etching stop layer in the uncovered areas of the carrier material.

27. The method according to claim 20, which comprises using chemical solvents for removing the mask.

28. The method according to claim 20, which comprises using a plasma incineration process for removing the mask.

29. The method according to claim 20, which comprises using a sputtering process for applying a bondable coating to the contact islands.

30. The method according to claim 20, which comprises applying a conductive adhesive by use of adhesive films.

31. The method according to claim 22, which comprises selecting the printing process from the group consisting of a screen printing process and a stencil printing process.

32. The method according to claim 20, which comprises using an injection-molding process for encapsulating the etching stop layer and the height-structured layer in a plastic molding compound.

33. The method according to claim 20, which comprises forming a structured insulating layer covering an underside of at least the interconnects by applying a soldering resist using a printing process.

34. The method according to claim 20, which comprises forming a structured insulating layer covering an underside of at least the interconnects by applying a photoresist using photolithographic process.

35. A method for producing a panel, which comprises the steps of:
  providing a metallic carrier material for forming a height-structured leadframe, the metallic carrier material selected from the group consisting of a metal plate and a metal strip;

applying a mask on a top side of the metallic carrier material, the mask having a matrix of uncovered areas exposing the metallic carrier material for forming contact islands, chip islands and height-structured interconnects in a plurality of device positions, each of the contact islands being connected to at least one of the chip islands and to one another partly through the height-structured interconnects;

applying an etching stop layer to the uncovered areas of the metallic carrier material;

applying a height-structured layer to the etching stop layer in the uncovered areas of the metallic carrier material resulting in a formation of height-structured components on the leadframe, the height-structured components including the contact islands, the chip islands and the interconnects;

removing the mask;

applying a bondable coating to the contact islands;

applying one of a solderable coating and a conductive adhesive to the chip islands;

applying circuit elements to the chip islands;

producing bonding connections and line bridges one of between electrodes of the circuit elements and one of the contact islands and between the contact islands; and embedding the height-structured components, the circuit elements and the bonding connections in a plastic molding compound for forming a one-sided packaging.

36. The method according to claim 35, which comprises using a photolithographic process for applying the mask.

37. The method according to claim 35, which comprises using a printing process selected from the group consisting of a screen printing process and a stencil printing, process for applying the mask.

38. The method according to claim 35, which comprises applying the etching stop layer by one of a sputtering process and a vapor deposition process.

39. The method according to claim 35, which comprises applying the etching stop layer by a chemical vapor deposition process.

40. The method according to claim 35, which comprises applying the etching stop layer by an electrodeposition process.

41. The method according to claim 35, which comprises applying the height-structured layer to the etching stop layer in the uncovered areas of the carrier material by an electrodeposition process.

42. The method according to claim 35, which comprises using chemical solvents for removing the mask.

43. The method according to claim 35, which comprises using a plasma incineration process for removing the mask.

44. The method according to claim 35, which comprises using a sputtering process for applying the bondable coating to the contact islands.

45. The method according to claim 35, which comprises using adhesive films for applying the conductive adhesive.

46. The method according to claim 35, which comprises producing the bonding connections by a process selected from the group consisting of a thermocompression process, a thermosonic process and an ultrasonic bonding process.

47. The method according to claim 35, which, comprises using an injection-molding process for producing the plastic molding compound.

48. The method according to claim 35, which comprises forming a structured insulating layer covering an underside of at least the interconnects by applying a soldering resist using a printing process.

49. The method according to claim 35, which comprises forming a structured insulating layer covering an underside of at least the interconnects by applying a photoresist using photolithographic process.

50. A method for producing an electronic device, which comprises the steps of:

providing a metallic carrier material for forming a height-structured leadframe, the metallic carrier material selected from the group consisting of a metal plate and a metal strip;

applying a mask on a top side of the metallic carrier material, the mask containing a matrix of uncovered areas exposing the metallic carrier material for forming contact islands, chip islands and height-structured interconnects in a plurality of device positions, the height-structured interconnects forming an interconnect network between the chip islands and the contact islands;

applying an etching stop layer to the uncovered areas of the metallic carrier material;

applying a height-structured layer to the etching stop layer in the uncovered areas of the metallic carrier material resulting in a formation of height-structured components of the height-structured leadframe, the height-structured components including the contact islands, the chip islands and the interconnects;

removing the mask;

applying a bondable coating to the contact islands;

applying one of a solderable coating and a conductive adhesive to the chip islands;

applying circuit elements to the chip islands;

producing bonding connections and line bridges between one of electrodes of the circuit elements and the contact islands and between the contact islands;

embedding the height-structured components, the circuit elements and the bonding connections in a plastic molding compound resulting in a one-sided packaging;

removing part of the height-structured leadframe at least as far as the etching stop layer;

applying a structured insulating layer on an underside of the height-structured leadframe for covering undersides at least of the interconnects; and separating the height-structured leadframe with the plastic molding compound into individual electronic devices.

51. The method according to claim 50, which comprises using a photolithographic process for applying the mask.

52. The method according to claim 50, which comprises using a printing process selected from the group consisting of a screen printing process and a stencil printing process for applying the mask.

53. The method according to claim 50, which comprises applying the etching stop layer by one of a sputtering process and a vapor deposition process.

54. The method according to claim 50, which comprises applying the etching stop layer by a chemical vapor deposition process.

55. The method according to claim 50, which comprises applying the etching stop layer by an electrodeposition process.

56. The method according to claim 50, which comprises applying the height-structured layer to the etching stop layer in the uncovered areas of the carrier material using an electrodeposition process.

57. The method according to claim 50, which comprises using chemical solvents for removing the mask.

58. The method according to claim 50, which comprises using a plasma incineration process for removing the mask.

59. The method according to claim 50, which comprises using a sputtering process for applying the bondable coating to the contact islands.

60. The method according to claim 50, which comprises using adhesive films for applying the conductive adhesive.

61. The method according to claim 50, which comprises producing the bonding connections by a process selected from the group consisting of a thermocompression process, a thermosonic process and an ultrasonic bonding process.

62. The method according to claim 50, which comprises using an injection-molding process for encapsulating the metallic carrier material, the etching stop layer, and the height-structured layer in the plastic molding compound.

63. The method according to claim 50, which comprises forming the structured insulating layer covering the underside of at least the interconnects by applying a soldering resist using a printing process.

64. The method according to claim 50, which comprises forming the structured insulating layer covering the underside of at least the interconnects by applying a photoresist using photolithographic process.

* * * * *